(12) United States Patent
Fiedler

(10) Patent No.: US 7,759,997 B2
(45) Date of Patent: Jul. 20, 2010

(54) MULTI-PHASE CORRECTION CIRCUIT

(75) Inventor: Alan S. Fiedler, Mountain View, CA (US)

(73) Assignee: Microsoft Corporation, Redmond, WA (US)

( * ) Notice: Subject to any disclaimer, the term of this patent is extended or adjusted under 35 U.S.C. 154(b) by 5 days.

(21) Appl. No.: 12/163,008

(22) Filed: Jun. 27, 2008

(65) Prior Publication Data

US 2009/0322388 A1 Dec. 31, 2009

(51) Int. Cl.
*H03K 3/00* (2006.01)
(52) U.S. Cl. .................. 327/233; 327/146; 327/296
(58) Field of Classification Search .............. 327/141, 327/144, 146, 161, 231, 233, 234, 237, 243, 327/291, 292, 295, 296, 149, 158, 152, 153
See application file for complete search history.

(56) References Cited

U.S. PATENT DOCUMENTS

| | | | |
|---|---|---|---|
| 5,063,579 A | 11/1991 | Sasaki | |
| 5,396,523 A | 3/1995 | Hedberg | |
| 5,436,939 A | 7/1995 | Co | |
| 5,781,055 A | 7/1998 | Bhagwan | |
| 6,137,328 A | 10/2000 | Sung | |
| 6,256,362 B1 | 7/2001 | Goldman | |
| 6,441,659 B1 | 8/2002 | Demone | |
| 6,441,667 B1 | 8/2002 | Boerstler et al. | |
| 6,480,049 B2 | 11/2002 | Boerstler et al. | |
| 6,633,190 B1 | 10/2003 | Alvandpour et al. | |
| 6,650,157 B2 | 11/2003 | Amick et al. | |
| 6,664,861 B2 * | 12/2003 | Murakami | 331/57 |
| 6,703,879 B2 | 3/2004 | Okuda et al. | |
| 6,717,887 B1 * | 4/2004 | Kono et al. | 365/189.14 |
| 6,943,599 B2 | 9/2005 | Ngo | |
| 7,009,441 B2 | 3/2006 | Fiedler | |
| 7,030,674 B2 | 4/2006 | Johnson | |
| 7,030,705 B2 * | 4/2006 | Kim | 331/16 |
| 7,054,374 B1 | 5/2006 | Jensen | |
| 7,068,086 B2 | 6/2006 | Takeda | |
| 7,088,158 B2 | 8/2006 | Block | |
| 7,116,746 B2 | 10/2006 | Nagano | |
| 7,221,723 B2 | 5/2007 | Walker | |
| 7,489,176 B2 * | 2/2009 | Kaviani et al. | 327/291 |
| 7,518,423 B2 * | 4/2009 | Kumata | 327/158 |
| 2003/0210758 A1 | 11/2003 | Lee | |
| 2005/0040876 A1 | 2/2005 | Jeon | |
| 2006/0208784 A1 | 9/2006 | Suzuki | |
| 2007/0098128 A1 | 5/2007 | Ishida et al. | |

OTHER PUBLICATIONS

Daneshgaran, F. et al., "Transceiver Front-End Technology for Software Radio Implementation of Wideband Satellite Communication Systems", Jul. 25, 2002, 29 pages, www.euroconcepts.it.

Liu, T-T. et al., "A 1-4 GHz DLL Based Low-Jitter Multi-Phase Clock Generator for Low-Band Ultra-Wideband Application", Aug. 4-5, 2004, IEEE Asia-Pacific Conference on Advanced System Integrated Circuits, 330-33.

(Continued)

*Primary Examiner*—Long Nguyen
*Assistant Examiner*—Sibin Chen
(74) *Attorney, Agent, or Firm*—Woodcock Washburn LLP

(57) ABSTRACT

A multi-phase correction circuit adjusts the phase relationship among multiple clock signals such that their rising edges are equidistant in time from one another.

20 Claims, 7 Drawing Sheets

Multi-Phase Correction Circuit

OTHER PUBLICATIONS

Wu, L. et al., "A Low-Jitter Skew-Calibrated Multi-Phase Clock generator for Time-Interleaved Applications", 2001, IEEE International Solid-State Circuits Conference, Session 25, 3 pages.

Eckerbert, D. et al., "A Mixed-Mode Delay-Locked-Loop Architecture", Proceedings of the 21st International Conference on Computer Design(ICCD), 2003, 3 pages.

* cited by examiner

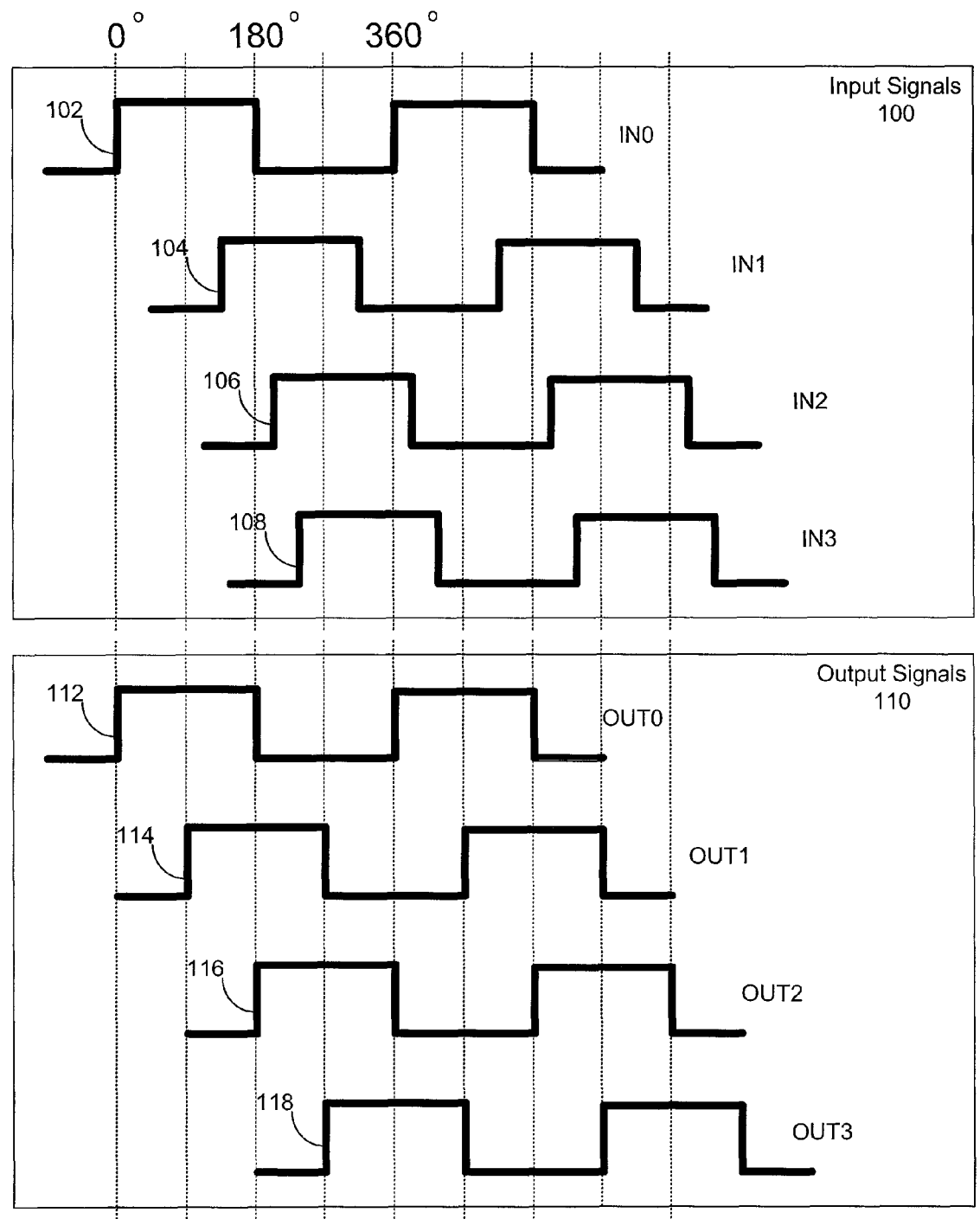
Fig. 1: Multi-Phase Correction Circuit Input and Output Signals

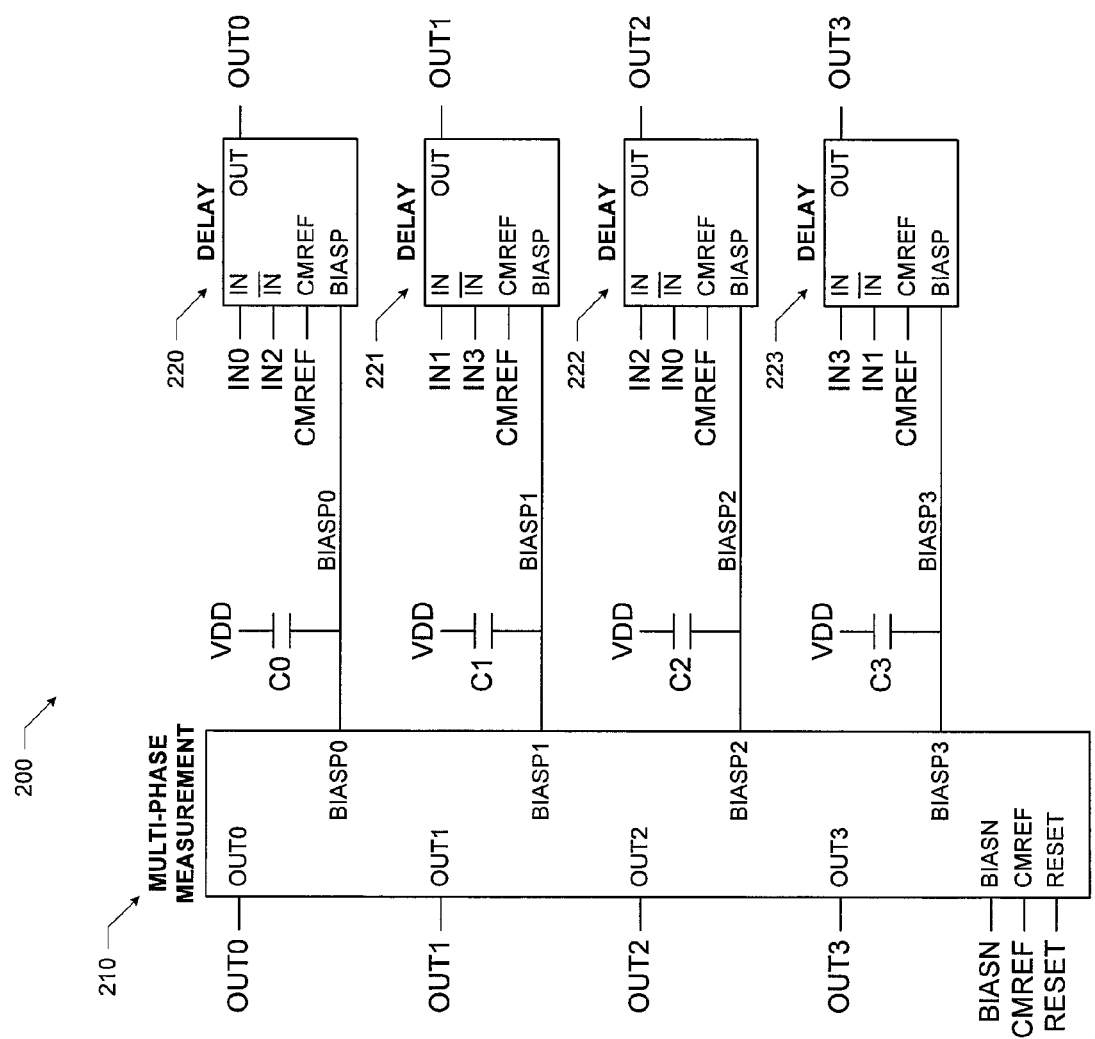
Fig. 2: Multi-Phase Correction Circuit

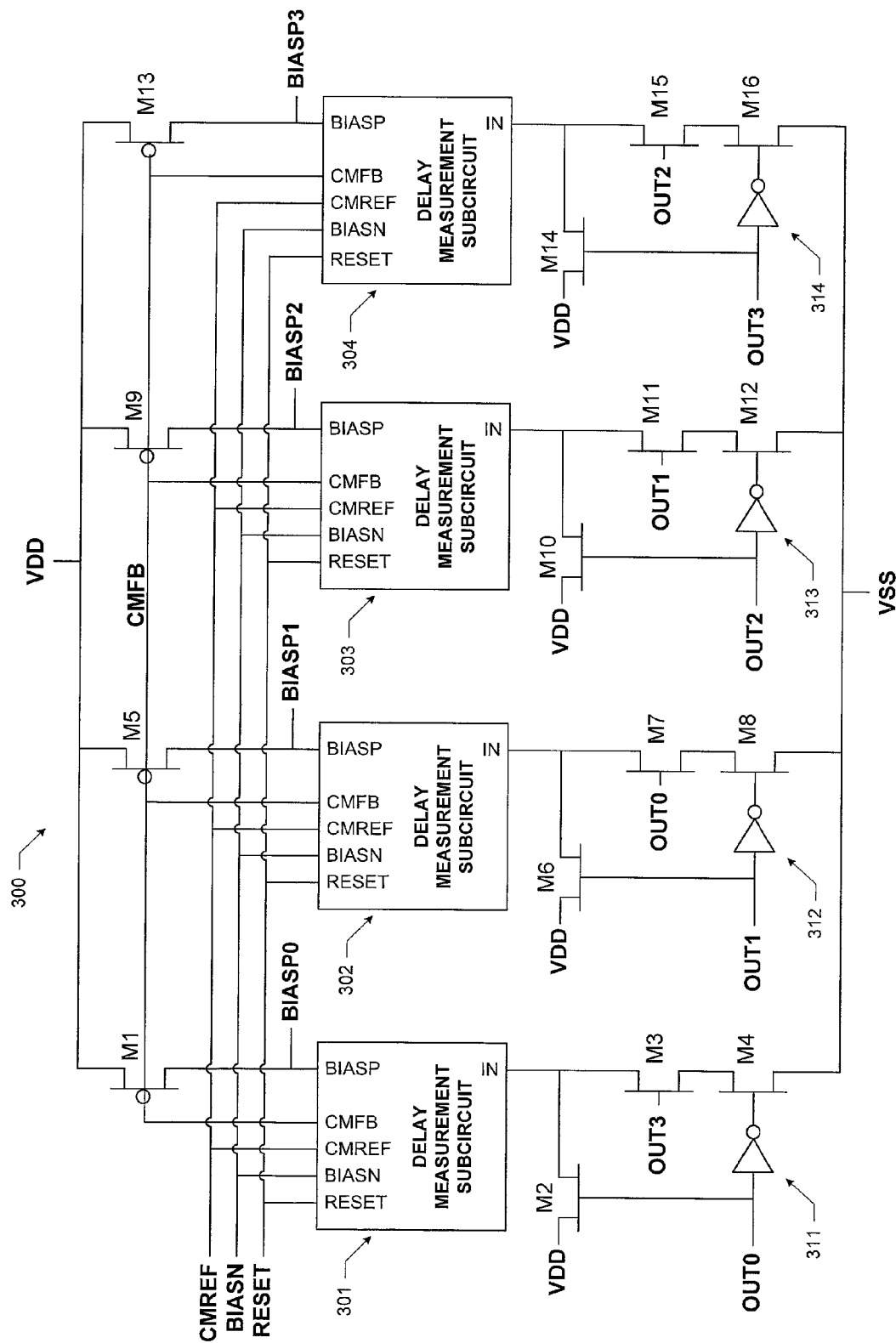
Fig. 3: Multi-Phase Measurement Circuit

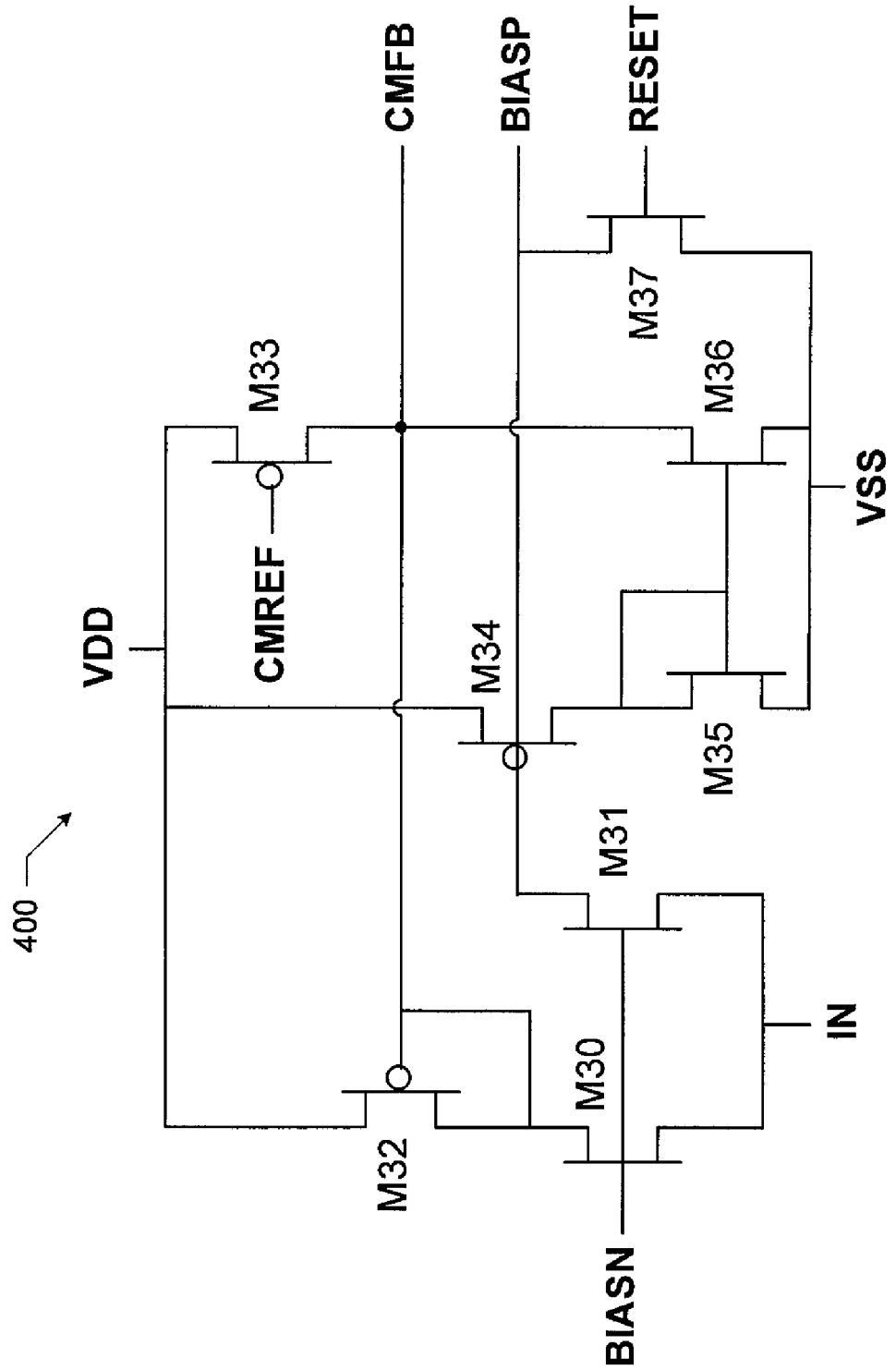
Fig. 4: Delay Measurement Subcircuit

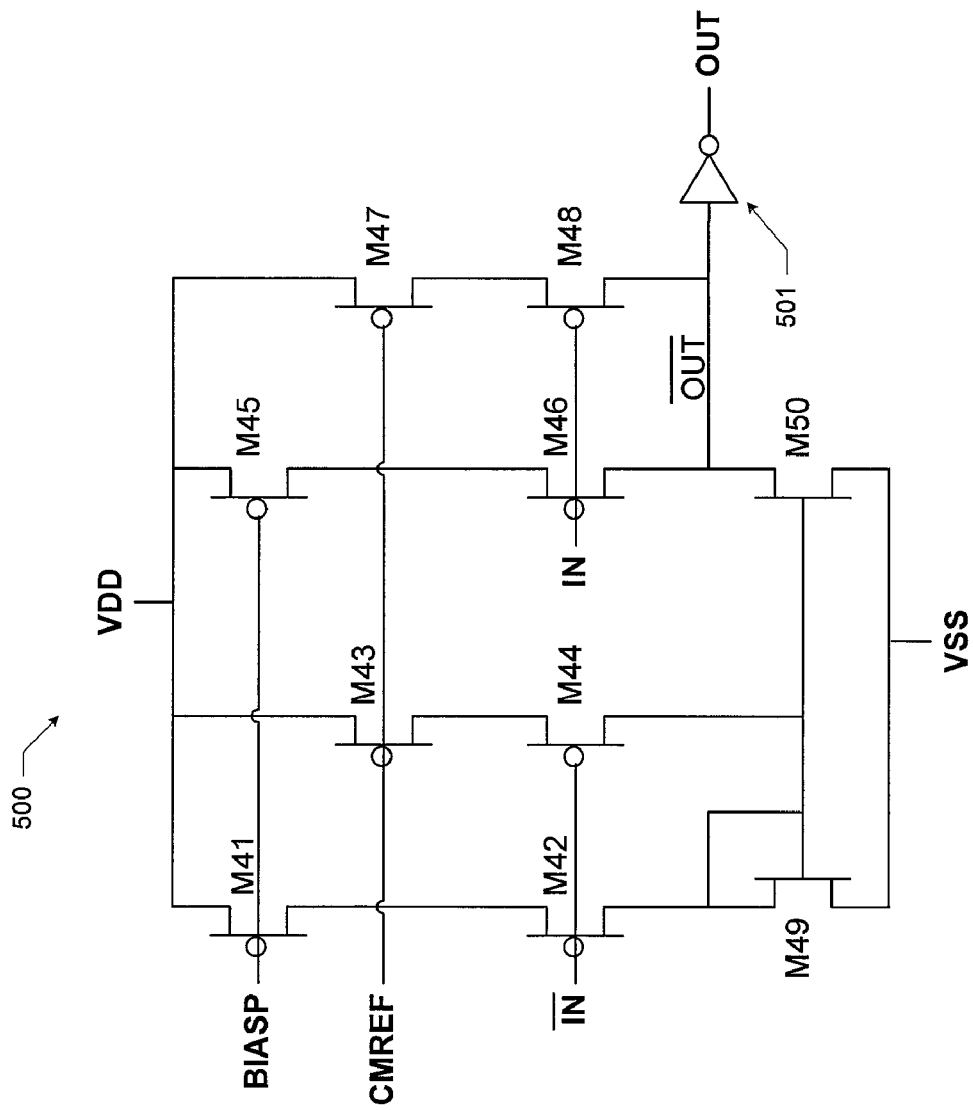
Fig. 5: Voltage-Controlled Delay Circuit

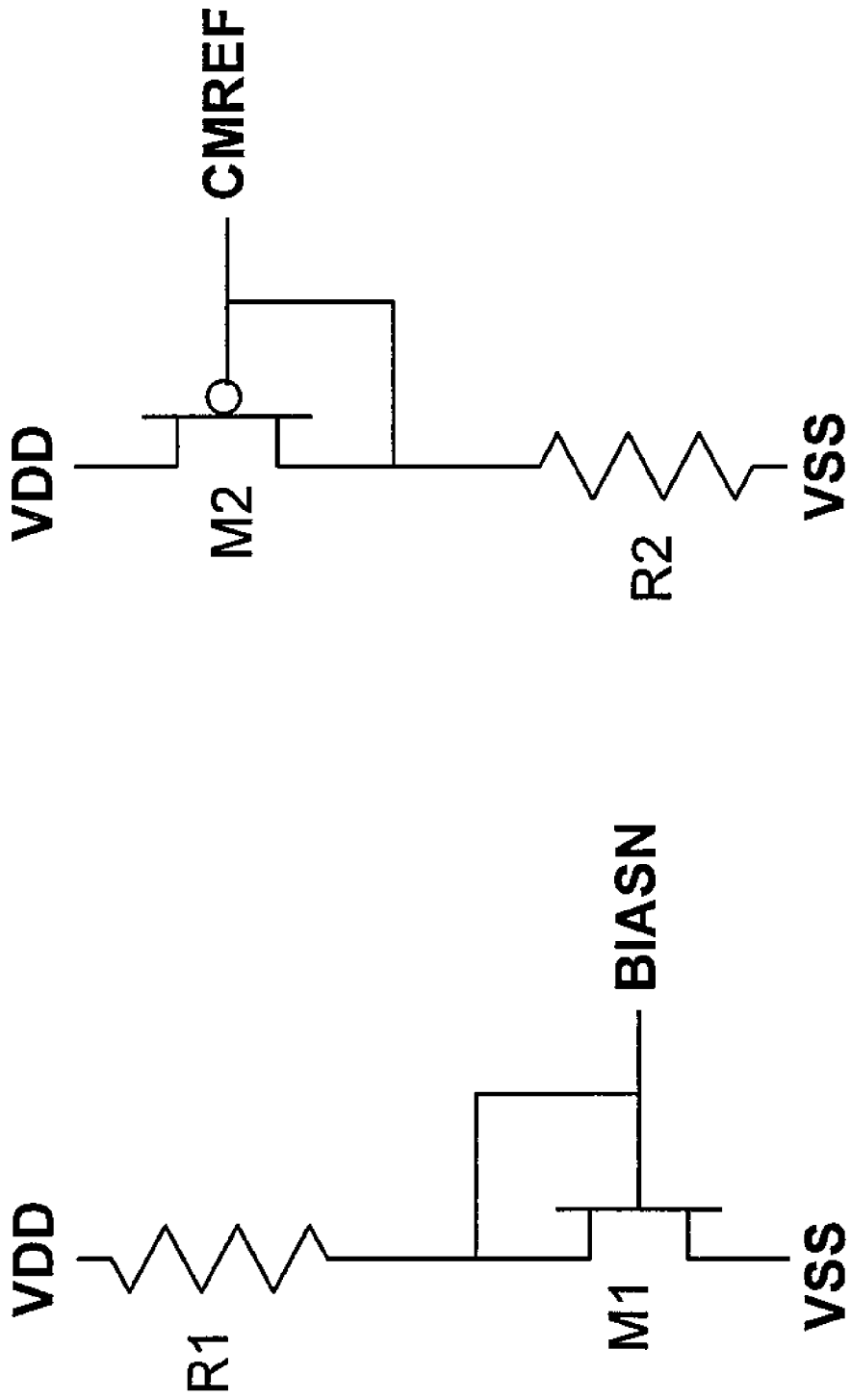
Fig. 6: Bias Generators

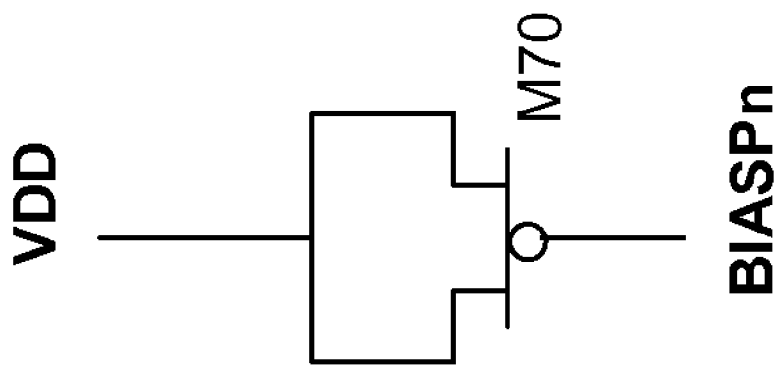
Fig. 7: Loop Filter Capacitor

MULTI-PHASE CORRECTION CIRCUIT

BACKGROUND

The control of multiple, accurately-spaced clock phases operating at one frequency is important to the design of many high-performance, high-speed chip-to-chip interconnect systems. While some interconnect systems use just two phases, e.g., the rising and falling edges of a single very high-speed clock, there are drawbacks to that approach, such as the difficulty of accurately controlling the duty-cycle of such a high-speed clock, as well as the necessity and difficulty of operating the high speed clock at a high frequency equal to ½ the data rate. The use of multiple clock signals with accurately spaced clock phases overcomes the disadvantages of a single clock approach. For example, because there are more clock phases, the frequency of these multi-phase clocks can be a fraction of the data rate, such as ½, ¼, ⅛, or 1/10. However, with multiple clock signals, problems can develop if the phase relationship among the various clock signals is not properly and accurately maintained.

SUMMARY

The present invention is directed to a multi-phase correction circuit that can adjust the phase relationship among multiple clock signals having rising edges that are nominally spaced equidistant in time from one another, yet may have substantial errors in this spacing, such that these spacing errors are substantially reduced. In one embodiment, each of four input clock signals operating at the same frequency and nominally spaced equidistant in time from one another, yet with spacing errors, are buffered so as to generate output clock signals whose rising edges are equidistant in time from one another and have substantially reduced spacing errors. In particular, the circuit measures the relative time-position of the rising edges of each of the output clock signals and adjusts their time positions such that the rising edge of each successive clock signal trails the rising edge of the preceding clock signal by the same amount.

BRIEF DESCRIPTION OF THE DRAWINGS

The foregoing summary and the following detailed description are better understood when read in conjunction with the appended drawings. For the purpose of illustrating the multi-phase correction circuit, there is shown in the drawings exemplary embodiments of various aspects of the circuit; however, the invention is not limited to the specific circuitry, methods and instrumentalities disclosed. In the drawings:

FIG. 1 is a diagram illustrating the adjustment of the phases of a set of clock signals in accordance with an embodiment of the present invention;

FIG. 2 is a circuit diagram illustrating one embodiment of a multi-phase correction circuit;

FIG. 3 is a circuit diagram illustrating one embodiment of a multi-phase measurement circuit which is used in the multi-phase correction circuit;

FIG. 4 is a circuit diagram illustrating one embodiment of a delay measurement subcircuit which is used in the multi-phase measurement circuit;

FIG. 5 is a circuit diagram illustrating one embodiment of a delay circuit which is used in the multi-phase correction circuit; and FIG. 6 is a circuit diagram illustrating one embodiment of bias generators which are used in connection with the multi-phase correction circuit; and FIG. 7 is a circuit diagram illustrating one embodiment of a loop filter capacitor used in the multi-phase correction circuit.

DETAILED DESCRIPTION

FIG. 1 is a diagram illustrating the adjustment of the phases of a set of clock signals in accordance with an embodiment of the present invention. In the example shown, four input signals, IN0, IN1, IN2 and IN3, each have substantially the same frequency. The respective rising edges 102, 104, 106 and 108 of these input signals are not, however, equally spaced. The multi-phase correction circuit of the present invention, one embodiment of which is illustrated in the following figures, generates output clock signals OUT0, OUT1, OUT2, and OUT3 from input signals IN0, IN1, IN2, and IN3 and having respective rising edges 112, 114, 116 and 118 that are substantially equidistant in time from one another.

As one example, each of the four input clock signals IN0, IN1, IN2 and IN3 may switch at 2.7 GHz (period=370 ps). The multi-phase correction circuit of FIG. 2 may buffer the input signals to generate the output clock signals OUT0, OUT1, OUT2 and OUT3. A portion of the multi-phase correction circuit may measure a relative time-position of the rising edges of each of the output clock signals and, by means of negative feedback, adjust the relative time positions such that the rising edge of OUT1 trails the rising edge of OUT0 by 370/4=92.5 ps, the rising edge of OUT2 trails the rising edge of OUT1 by 370/4=92.5 ps, the rising edge of OUT3 trails the rising edge of OUT2 by 370/4=92.5 ps, and the next rising edge of OUT0 trails the rising edge of CLK3 by 370/4=92.5 ps.

FIG. 2 is a circuit diagram illustrating one embodiment of the multi-phase correction circuit. In this embodiment, voltage-controlled delay circuits 220, 221, 222, and 223 each accept two of four multi-phase input signals IN0, IN1, IN2, and IN3 and generate multi-phase output signals OUT0, OUT1, OUT2, and OUT3. Signal delay through each delay circuit from IN and /IN to OUT is controlled by a respective one of four delay control bias voltages BIASP0, BIASP1, BIASP2, and BIASP3. A multi-phase measurement circuit 210 generates the delay control bias voltages in response to measured phase relationships between the output signals. The combined action of the delay circuits and the multi-phase measurement circuit forms four phase control loops having negative feedback, substantial open-loop gain, a loop frequency response compensated with capacitors C0, C1, C2, and C3, and results in substantially lower phase errors in the output signals, compared to those which may exist in the input signals.

FIG. 3 illustrates further details of one embodiment 300 of the multi-phase measurement circuit 210 of FIG. 2. In this circuit, delay measurement subcircuit 301, transistors M2, M3, and M4, and inverter 311 work together to draw a current from BIASP0 which is inversely proportional to the time between a rising edge of OUT3 and a rising edge of OUT0. Similarly, delay measurement subcircuit 302, transistors M6, M7, and M8, and inverter 312 work together to draw a current from BIASP0 which is inversely proportional to the time between a rising edge of OUT0 and a rising edge of OUT1, delay measurement subcircuit 303, transistors M10, M11, and M12, and inverter 313 work together to draw a current from BIASP0 which is inversely proportional to the time between a rising edge of OUT1 and a rising edge of OUT2, and delay measurement subcircuit 304, transistors M14, M15, and M16, and inverter 314 work together to draw a current from BIASP0 which is inversely proportional to the time between a rising edge of OUT2 and a rising edge of OUT3.

To cause an average voltage of BIASP0, BIASP1, BIASP2, and BIASP3 to be substantially equal to a common mode reference voltage CMREF, transistors M1, M5, M9, and M13 each source a substantially equal current onto BIASP0, BIASP1, BIASP2, and BIASP3, respectively, whereas a magnitude of the equal current is set by a common-mode feedback voltage CMFB. The CMFB voltage is set by combined action of delay measurement subcircuits 301, 302, 303, and 304.

When the multi-phase measurement circuit 300 is coupled to four delay circuits as illustrated in FIG. 2, four control loops result, each of which has negative feedback and substantial open-loop gain. Appropriately sized loop filter capacitors C0, C1, C2, and C3 of the phase correction circuit in FIG. 2 integrate current from four instances of transistor M31 of FIG. 4 (see below) and transistors M1, M5, M9, and M13 of FIG. 3 (see below) that are coupled to BIASP0, BIASP1, BIASP2, and BIASP3, respectively, and also provide for control loop stability. As shown in FIG. 7, in one embodiment, each loop filter capacitor comprises a p-type field effect transistor (PFET) M70 having a gate coupled to the respective BIASPn node [n=0,1,2,3] and a source and drain coupled to a first power supply terminal VDD.

FIG. 4 is a circuit diagram illustrating one embodiment 400 of the delay measurement subcircuit, four instances of which are used in the multi-phase measurement circuit of FIG. 3 at 301, 302, 303, and 304. Common-gate transistors M30 and M31 are configured to operate as switched current sources which conduct when input IN is shorted to a second power supply terminal VSS by transistors in the multi-phase measurement circuit. Transistors M32, M33, M34, M35, and M36 work together to generate a voltage on common-mode feedback control node CMFB such that the average voltage of BIASP0, BIASP1, BIASP2, and BIASP3 of the phase measurement circuit is substantially equal to the voltage of CMREF. In a preferred embodiment, all transistors of FIG. 4 but M37 have a width and length substantially larger than the minimum allowed by the technology so as to provide for good matching. By asserting RESET high, transistor M37, having a gate coupled to RESET, a source coupled to power supply terminal VSS and a drain coupled to BIASP, provides a means to exit an invalid yet potentially stable control loop state in which the voltage at BIASP is substantially equal to power supply voltage VDD.

FIG. 5 is a circuit diagram illustrating one embodiment 500 of the voltage-controlled delay circuit, four instances of which are placed in FIG. 2 at 220, 221, 222 and 223. The delay circuit operates as a buffer having complementary signal inputs IN and /IN, a single-ended signal output OUT, a controllable insertion delay defined as a delay from a transition on the complementary inputs to a transition on the output, a third input BIASP to control the insertion delay, and a static fourth input CMREF to set the maximum insertion delay. PFET transistors M41 and M43 each control a current conducted to PFET switches M42 and M44, respectively, and the sum of these currents is mirrored to /OUT as a pull-down current by n-type field effect transistors (NFETs) M49 and M50. Similarly, PFET transistors M45 and M47 each control a current conducted to PFET switches M46 and M48, respectively, and the sum of these currents form a pull-up current on /OUT. Through adjustment of the voltage of BIASP, the pull-up and pull-down currents are adjusted proportionately, thereby also adjusting the rise and fall time of /OUT, and ultimately, the insertion delay. Static input CMREF and PFETS M43, M44, M47, and M48 are optional, and when used, set a maximum insertion delay and a maximum phase control open loop gain so as to assist in the stability of the phase control loops of the phase correction circuit.

FIG. 6 is a circuit diagram illustrating one embodiment of the bias generators used to generate a voltage at BIASN and a voltage at CMREF in FIG. 2. Each generator comprises a diode-connected transistor and a resistor. Those skilled in the art will recognize the operation of these circuits, and will further recognize the appropriate choice of resistor value and transistor size. In a preferred embodiment, and to provide for good transistor matching and bandwidth, a resistance value of R1 and a transistor size of M1 are chosen so as to provide for a substantial gate bias above threshold of transistors M30 and M31 of FIG. 4. Further, in the preferred embodiment, and to provide for good transistor matching, a resistance value of R2 and a transistor size of M2 are chosen so as to provide for a substantial gate bias above threshold of transistors M1, M5, M9, and M13 of FIG. 3, and of transistors M33, M34, M35, and M36 of FIG. 4. Finally, in the preferred embodiment, a resistance value of R2 and a transistor size of M2 are chosen so as to provide for a voltage at CMREF being neither too close to power supply voltage VSS nor too close to power supply voltage VDD, thereby providing for an appropriate control voltage range at BIASPn [n=0,1,2,3] and an appropriate range of insertion delay control for delay circuits 220, 221, 222, and 223 of FIG. 2.

While circuitry has been described and illustrated with reference to specific embodiments, those skilled in the art will recognize that modification and variations may be made without departing from the principles described above and set forth in the following claims. For example, although in the embodiments described above, four clock signals are processed, the circuitry disclosed above may be scaled to process any even number of fewer or more clock signals. For example, the circuitry may be scaled to process as few as two clock signals or may be scaled to process any even number of clock signals more than four. Accordingly, reference should be made to the following claims as describing the scope of the present invention.

What is claimed:

1. A multi-phase correction circuit for adjusting the phases of a positive integer, N, of input clock signals to produce N respective output clock signals whose rising edges are equidistant in time from one another, the multi-phase correction circuit comprising:

N instances of a voltage controlled delay circuit, each instance of the voltage controlled delay circuit receiving a respective pair of the input clock signals and a respective one of N delay control bias voltages and producing a respective one of the output clock signals therefrom, a signal delay through the voltage controlled delay circuit from the respective inputs to the respective output being controlled by the respective delay control bias voltage; and a multi-phase measurement circuit that generates the N delay control bias voltages in response to measured phase relationships between the output clock signals.

2. The multi-phase correction circuit of claim 1, wherein each of the input clock signals has a substantially equal frequency and period, and wherein the rising edges of the output clock signals are equidistant in time from one another over the period of said output clock signals.

3. The multi-phase correction circuit of claim 2, wherein the combined operation of the N voltage controlled delay circuits and the multi-phase measurement circuit forms N phase control loops having negative feedback and substantial open-loop gain.

4. The multi-phase correction circuit of claim 3, further comprising N capacitors coupled to the circuit to compensate the frequency response of each respective phase control loop.

5. The multi-phase correction circuit of claim 4, wherein each capacitor comprises a p-type field effect transistor (PFET) having a gate coupled to a respective one of the N delay control bias voltages and a source and drain coupled to a first power supply terminal (VDD) of the multi-phase correction circuit.

6. The multi-phase correction circuit of claim 1, wherein the multi-phase measurement circuit comprises:
N instances of a delay measurement subcircuit, each instance of the delay measurement subcircuit being coupled to respective first, second and third transistors and an inverter, the delay measurement subcircuit, the first, second and third transistors, and the inverter working together to draw a current from a respective one of the delay control bias voltages which is inversely proportional to the time between a rising edge of a respective one of the output clock signals and a rising edge of a next adjacent clock signal in time; and
N other transistors that operate to cause an average voltage of the N delay control bias voltages to be substantially equal to a common mode reference voltage (CMREF), each of the N other transistors sourcing a substantially equal current onto the respective delay control bias voltage, a magnitude of the equal current being set by a common-mode feedback voltage determined by the combined operation of said N delay measurement subcircuits.

7. The multi-phase correction circuit of claim 6, wherein each instance of said delay measurement subcircuit comprises:
a pair of common-gate transistors configured to operate as switched current sources which conduct when shorted to a second power supply terminal (VSS) by the respective first, second and third transistors coupled to the delay measurement subcircuit; and
a set of transistors that work together to generate the common-mode feedback voltage such that the average of the delay control bias voltages becomes substantially equal to the common mode reference voltage (CMREF).

8. The multi-phase correction circuit of claim 7, wherein the first, second, and third transistors associated with the respective delay measurement subcircuit each have a gate, a source and a drain, and the inverter associated with the respective delay measurement subcircuit has an input and an output, and wherein,
the input of the inverter receives said next adjacent clock signal in time and its output is coupled to the gate of the first transistor,
the source of the first transistor is coupled to power supply terminal (VSS) and its drain is coupled to the source of the second transistor,
the gate of the second transistor receives said respective one of the output clock signals and its drain is coupled to an input of the respective delay measurement subcircuit,
the source of the third transistor is connected to the input of the respective delay measurement subcircuit, its drain is connected to the first power supply terminal (VDD), and its gate receives said next adjacent clock signal.

9. The multi-phase correction circuit of claim 8, wherein each instance of the delay measurement subcircuit comprises a pair of common-gate transistors each having a gate, a source and a drain, and a set of transistors comprising first, second, third, fourth and fifth transistors, and wherein, the common gates of the pair of common-gate transistors are coupled to a (BIASN) terminal that receives a voltage, the sources of the pair of common-gate transistors define the input to the delay measurement subcircuit, the drain of a first one of the common-gate transistors being coupled to common-mode feedback (CMFB) node and to a drain of the first transistor of said set of transistors, the drain of the second one of the common-gate transistors being connected to a (BIASP) output node,
the gate of the first transistor is connected to the (CMFB) node, and its source is connected to the first power supply terminal (VDD),
the gate of the second transistor of the set is connected to the (BIASP) output node, its source is coupled to the first power supply terminal (VDD), and its drain is coupled to both the drain and the gate of the third transistor,
the source of the third transistor is coupled to the second power supply terminal and its gate is coupled to the gate of the fourth transistor,
the source of the fourth transistor is coupled to the second power supply terminal and its drain is coupled to the (CMFB) node,
the drain of the fifth transistor is coupled to the (CMFB) node, its source is coupled to the first power supply terminal (VDD) and its gate is coupled to receive the common mode reference voltage (CMREF).

10. The multi-phase correction circuit of claim 9, additionally having a first and second bias generator, wherein
the first bias generator comprises a first resistor coupled between the first power supply terminal (VDD) and the (BIASN) terminal, and a first transistor having a gate and a drain coupled to the (BIASN) terminal and a source coupled to power supply terminal (VSS); and
the second bias generator comprises a second resistor coupled between the second power supply terminal VSS and common mode reference voltage (CMREF), and a second transistor having a gate and a drain coupled to common mode reference voltage (CMREF) and a source coupled to power supply terminal (VDD).

11. The multi-phase correction circuit of claim 6, wherein each of said N other transistors has a gate, a source and a drain, and wherein the gate of each of said N other transistors is coupled to receive a common-mode feedback signal (CMFB) from the delay measurement subcircuits, the drain is coupled to receive a respective delay control bias voltage, and the source is coupled to the first power supply terminal (VDD) of the multi-phase correction circuit.

12. The multi-phase correction circuit of claim 1, wherein for each of the N voltage-controlled delay circuits, the respective pair of input clock signals input to the circuit define complimentary signal inputs (IN) and (/IN), and wherein the signal delay through the voltage controlled delay circuit comprises a delay from a transition on the complementary inputs to a transition on the respective output clock signal.

13. The multi-phase correction circuit of claim 12, wherein each voltage-controlled delay circuit comprises:
a first (PFET) transistor and a first (PFET) switch, the first (PFET) transistor receiving as an input the respective delay control bias voltage, and the first (PFET) switch receiving one of the complementary input clock signals (/IN), the first (PFET) transistor controlling a current conducted to the first (PFET) switch;
a pair of (NFET) transistors that mirror the sum of the current conducted to the first (PFET) switch as a pull-down current on an output clock signal precursor;
a second (PFET) transistor and a second (PFET) switch, the second (PFET) transistor also receiving as an input the respective delay control bias voltage, and the second (PFET) switch receiving the other of the complementary input clock signals (IN), the second (PFET) transistor controlling a current conducted to the second (PFET) switch and that current forming a pull-up current on the output clock signal precursor, wherein the magnitude of the respective delay control bias voltage controls the pull-up and pull-down currents which in turn control the rise and fall times of the output clock signal and therefore the delay imposed by the voltage controlled delay circuit; and an inverter having an input and an output, whereas the inverter input is coupled to the output clock signal precursor, and the inverter output is coupled to the output clock signal.

14. The multi-phase correction circuit of claim 13, wherein the voltage controlled delay circuit further comprises:

a third (PFET) transistor and a third (PFET) switch, the third (PFET) transistor receiving as an input the common mode reference voltage (CMREF), and the third (PFET) switch receiving said complementary input clock signal (/IN), the third (PFET) transistor controlling a current conducted to the third (PFET) switch, the current conducted to the third (PFET) switch being summed with the current conducted to the first (PFET) switch by the first (PFET) transistor and the summed current being mirrored by said pair of (NFET) transistors as the pull-down current on said output clock signal precursor; and a fourth (PFET) transistor and a fourth (PFET) switch, the fourth (PFET) transistor also receiving as an input the common mode reference voltage (CMREF), and the fourth (PFET) switch receiving the other complementary input clock signal (IN), the fourth (PFET) transistor controlling a current conducted to the fourth (PFET) switch and that current being summed with the current conducted to the second (PFET) switch to form said pull-up current on the output clock signal precursor, wherein the third and fourth (PFET) transistors and third and fourth (PFET) switches operate to influence the pull-up and pull-down currents so as to set a maximum delay.

15. The multi-phase correction circuit of claim 1, wherein N is even and is equal to or greater than two.

16. The multi-phase correction circuit of claim 15, where N is equal to four.

17. A multi-phase correction circuit for adjusting the phases of a positive integer, N, of input clock signals to produce N respective output clock signals whose rising edges are equidistant in time from one another, the multi-phase correction circuit comprising:

N instances of a voltage controlled delay circuit, each instance of the voltage controlled delay circuit receiving a respective pair of the input clock signals and a respective one of N delay control bias voltages and producing a respective one of the output clock signals therefrom, a signal delay through the voltage controlled delay circuit from the respective inputs to the respective output being controlled by the respective delay control bias voltage;

a multi-phase measurement circuit that generates the N delay control bias voltages in response to measured phase relationships between the output clock signals, each of the input clock signals having a substantially equal frequency and period, and the rising edges of the output clock signals being equidistant in time from one another over the period of said clock signals, the combined operation of the N voltage controlled delay circuits and the multi-phase measurement circuit forming N phase control loops having negative feedback and substantial open-loop gain; and the multi-phase correction circuit further comprising N capacitors coupled to the circuit to compensate the frequency response of each respective phase control loop.

18. The multi-phase correction circuit of claim 17, wherein the multi-phase measurement circuit comprises:

N instances of a delay measurement subcircuit, each instance of the delay measurement subcircuit being coupled to respective first, second and third transistors and an inverter, the delay measurement subcircuit, the first, second and third transistors, and the inverter working together to draw a current from a respective one of the delay control bias voltages which is inversely proportional to the time between a rising edge of a respective one of the output clock signals and a rising edge of a next adjacent clock signal in time; and N other transistors that operate to cause an average voltage of the N delay control bias voltages to be substantially equal to a common mode reference voltage (CMREF), each of the N other transistors sourcing a substantially equal current onto the respective delay control bias voltage, a magnitude of the equal current being set by a common-mode feedback voltage determined by the combined operation of said N delay measurement subcircuits.

19. The multi-phase correction circuit of claim 18, wherein each instance of said delay measurement subcircuit comprises:

a pair of common-gate transistors configured to operate as switched current sources which conduct when shorted to a second power supply terminal (VSS) by the respective first, second and third transistors coupled to the delay measurement subcircuit; and a set of transistors that work together to generate the common-mode feedback voltage such that the average of the delay control bias voltages becomes substantially equal to the common mode reference voltage (CMREF).

20. A multi-phase correction circuit for adjusting the phases of a positive integer, N, of input clock signals to produce N respective output clock signals whose rising edges are equidistant in time from one another, the multi-phase correction circuit comprising:

N instances of a voltage controlled delay circuit, each instance of the voltage controlled delay circuit receiving a respective one of N delay control bias voltages and a respective pair of the input clock signals, the pair of input clock signals defining complimentary signal inputs (IN) and (/IN), and the instance producing from said inputs one of the output clock signals, a signal delay from a transition on the complementary inputs to a transition on the respective output clock signal being controlled by the respective delay control bias voltage; and a multi-phase measurement circuit that generates the N delay control bias voltages in response to measured phase relationships between the output clock signals, each voltage-controlled delay circuit further comprising:

a first (PFET) transistor and a first (PFET) switch, the first (PFET) transistor receiving as an input the respective delay control bias voltage, and the first PFET switch receiving one of the complementary input clock signals (/IN), the first (PFET) transistor controlling a current conducted to the first (PFET) switch;

a pair of (NFET) transistors that mirror the sum of the current conducted to the first (PFET) switch as a pull-down current on an output clock signal precursor;

a second (PFET) transistor and a second (PFET) switch, the second (PFET) transistor also receiving as an input the respective delay control bias voltage, and the second (PFET) switch receiving the other of the complementary input clock signals (IN), the second (PFET) transistor controlling a current conducted to a second (PFET) switch and that current forming a pull-up current on the output clock signal precursor, wherein the magnitude of the respective delay control bias voltage controls the pull-up and pull-down currents which in turn control the rise and fall times of the output clock signal and therefore the delay imposed by the voltage controlled delay circuit; and an inverter having an input and an output, whereas the inverter input is coupled to the output clock signal precursor, and the inverter output is coupled to the output clock signal;

the multi-phase measurement circuit further comprising:

N instances of a delay measurement subcircuit, each instance of the delay measurement subcircuit being coupled to respective first, second and third transistors and an inverter, the delay measurement subcircuit, the first, second and third transistors, and the inverter working together to draw a current from a respective one of the delay control bias voltages which is inversely proportional to the time between a rising edge of a respective one of the output clock signals and a rising edge of a next adjacent clock signal in time; and N other transistors that operate to cause an average voltage of the N delay control bias voltages to be substantially equal to a common mode reference voltage (CMREF), each of the N other transistors sourcing a substantially equal current onto the respective delay control bias voltage, a magnitude of the equal current being set by a common-mode feedback voltage determined by the combined operation of said N delay measurement subcircuits.

* * * * *